United States Patent
Häusler et al.

(10) Patent No.: US 7,033,852 B2
(45) Date of Patent: Apr. 25, 2006

(54) METHOD AND DEVICE FOR PASSIVATION OF THE RESONATOR END FACES OF SEMICONDUCTOR LASERS BASED ON III-V SEMICONDUCTOR MATERIAL

(75) Inventors: Karl Häusler, Berlin (DE); Nils Kirstaedter, Berlin (DE)

(73) Assignee: Lumics GmbH, Berlin (DE)

( * ) Notice: Subject to any disclaimer, the term of this patent is extended or adjusted under 35 U.S.C. 154(b) by 17 days.

(21) Appl. No.: 10/381,810

(22) PCT Filed: Sep. 25, 2001

(86) PCT No.: PCT/DE01/03723

§ 371 (c)(1),
(2), (4) Date: Mar. 31, 2003

(87) PCT Pub. No.: WO02/27875

PCT Pub. Date: Apr. 4, 2002

(65) Prior Publication Data

US 2004/0032893 A1 Feb. 19, 2004

(30) Foreign Application Priority Data

Sep. 29, 2000 (DE) ................. 100 48 475

(51) Int. Cl.
*H01L 21/00* (2006.01)
*H01S 5/00* (2006.01)

(52) U.S. Cl. ........................... 438/38; 372/49
(58) Field of Classification Search ............ 372/43–50;
438/38
See application file for complete search history.

(56) References Cited

U.S. PATENT DOCUMENTS

| 4,656,638 | A | | 4/1987 | Tihanyi et al. ............. 372/49 |
| 5,063,173 | A | * | 11/1991 | Gasser et al. ............ 438/38 |
| 5,571,750 | A | * | 11/1996 | Watanabe et al. .......... 438/33 |
| 5,665,637 | A | | 9/1997 | Chand .................... 372/46 |
| 5,721,752 | A | * | 2/1998 | Takagi ................... 372/49 |
| 5,799,028 | A | | 8/1998 | Geels et al. ............. 372/49 |
| 5,933,705 | A | | 8/1999 | Geels et al. ............. 438/26 |

(Continued)

FOREIGN PATENT DOCUMENTS

DE      690 09 474 T2    6/1994

(Continued)

OTHER PUBLICATIONS

Uchida Mamoru, Patent Abstracts of Japan, "Formation Of Edge Face Protective Film Of Semiconductor Laser", Publication No. 01138784, Publication Date: May 31, 1989.

(Continued)

*Primary Examiner*—MinSun Oh Harvey
*Assistant Examiner*—James Menefee

(57) ABSTRACT

A method and device for passivating the resonator end faces, in particular the cleaved edges of semiconductor laser diodes, by high-temperature epitaxy of the quaternary compound semiconductor $In_xGa_{1-x}As_yP_{1-y}$, where ($0 \leq x \leq 1$ and $0 \leq y \leq 1$). To passivate the $In_xGa_{1-x}As_yP_{1-y}$, an additional passivation layer may be applied in situ. The semiconductor crystal is brought to the temperature required for the epitaxy by being heated. To avoid thermal destruction of the contact metal during the epitaxy, the metal is only deposited after the cleaving operation and the passivation. The deposition of the metal on the passivated laser bar is carried out by means of special equipment that allows deposition of metal on the entire surface of the laser and at the same time prevents vapour deposition on the cleaved edges. The method and device can be applied to the production of high-power laser diodes.

8 Claims, 3 Drawing Sheets

U.S. PATENT DOCUMENTS

| | | | | |
|---|---|---|---|---|
| 5,962,873 | A | * | 10/1999 | Ohkubo et al. ............... 257/94 |
| 6,067,310 | A | * | 5/2000 | Hashimoto et al. ........... 372/49 |
| 6,080,598 | A | * | 6/2000 | Kawai .......................... 438/33 |
| 6,285,700 | B1 | * | 9/2001 | Ueno et al. ................... 372/49 |

FOREIGN PATENT DOCUMENTS

| | | |
|---|---|---|
| DE | 697 01 370 T2 | 3/2000 |
| EP | 0 416 190 A1 | 3/1991 |
| EP | 0 474 952 A1 | 3/1992 |
| EP | 0 822 628 B1 | 2/1998 |
| EP | 0 845 839 A1 | 6/1998 |

OTHER PUBLICATIONS

Iwai Norihiro, Patent Abstracts of Japan, "Manufacture Of Semiconductor Laser Bar", Publication No. 2000133870, Publication Date: May 12, 2000.

Kazuaki Sasaki, et al., Realization of Highly Reliable High-Power Operation of Single-Stripe AlGaAs Lasers by the Formation of Window Grown on Facets, Japanese Journal of Applied Physics, Publication Office Japanese Journal of Applied Physics, Tokyo, Japan, Aug. 27, 1991, pp. 111-113.

A. Al-Muhanna et al., "High-power (>10 W) continuous-wave operation from 100-μm-aperture 0.97-μm-emitting Al-free diode lasers", Applied Physics Letters, 1998, vol. 73, pp. 1182-1184, no month.

Richard Beaudry et al, Photoreflectance study of phosphorus passivation of GaAs (001), Journal Applied Physics, 2000, vol. 87 (11), pp. 7838-7844, no month.

H.C. Ko et al., "Surface preparation effect of GaAs(110) substrates on the ZnSe epitaxial layer grown by molecular beam epitaxy", Applied Physics A, 1999, vol. 68, pp. 627-629, no month.

P. Collot et al., "Sulphur passivation of dry-etched AlGaAs laser facets", Electronics Letters, 1999, vol. 35 (6), pp. 506-508, no month.

Boguslawa Adamowicz, et al., "Computer analysis of photon-induced non-equlibrium phenomena at Si and AlGaAs surfaces", VACUUM, Journal, 2000, vol. 57, pp. 111-120, no month.

* cited by examiner

Prior Art

METHOD AND DEVICE FOR PASSIVATION OF THE RESONATOR END FACES OF SEMICONDUCTOR LASERS BASED ON III-V SEMICONDUCTOR MATERIAL

BACKGROUND OF THE INVENTION

The present invention relates in general terms to the field of production of semiconductor lasers based on III–V semiconductor material, in particular semiconductor lasers of this type which are produced by being cleaved from a larger semiconductor crystal (bar) and accordingly have cleaved edges. In particular, in this context the invention relates to a method for passivating these cleaved edges or, in general terms, the resonator end faces of semiconductor lasers.

First of all, the conventional production of the semiconductor lasers will be explained in more detail with reference to FIGS. 1a, b. Production takes place substantially in three steps. First of all, a laser structure is produced by epitaxial coating of a semiconductor crystal. Secondly, the laser structure is processed by lithography and provided with contact metal. Thirdly, the laser mirrors are produced by cleaving the crystal along the [110] crystal axes (in the case of polar compound semiconductors). This cleaving operation also defines the resonator length of the laser, which is limited by two opposite cleaved surfaces 5 which serve as mirrors. The cleaving operation produces a semiconductor strip (laser bar) which includes a large number of laser diodes. The laser diodes can comprise prestructured strips 4 which are arranged next to one another on the laser bar (FIG. 2a). The individual laser diodes 6 can be cleaved from the laser bar.

Methods for passivating the cleaved edge of semiconductor laser diodes that deviate from this invention are known (for example U.S. Pat. No. 4,656,638, U.S. Pat. No. 5,063, 173, U.S. Pat. No. 5,665,637, U.S. Pat. No. 5,933,705). The benefit of the passivation manifests itself in a significant increase in the service life of the laser diode at high optical outputs. The effect of the passivation is attributable to the problem that the surface of semiconductor crystals has defects which originate from unsaturated surface bonds and from oxides and impurities which are formed in the atmosphere. While the laser diode is operating, these surface defects lead to absorption of the laser light at the cleaved edge, which simultaneously serves as a mirror surface of the laser. Consequently, the mirror surface is heated, with the result that, at a high optical power density, sudden destruction of the laser diode results. This effect is described in the literature as catastrophic optical mirror damage (journal "APPLIED PHYSICS LETTERS", 1998, volume 73 (9), pages 1182–1184). The density of the surface defects is reduced by passivation as a result of partial saturation of the surface bonds ("JOURNAL OF APPLIED PHYSICS", 2000, volume 87 (11), pages 7838–7844). At the same time, oxidation and contamination are prevented (U.S. Pat. No. 5,063,173).

According to the prior art, the passivation of the cleaved edge of semiconductor laser diodes is carried out using thin films consisting of the elements Si, Ge or Sb (U.S. Pat. No. 5,063,173) or the II–VI compound semiconductors (U.S. Pat. No. 5,665,637), such as ZnSe, and other materials (e.g. U.S. Pat. No. 4,656,638, EP 845839). Hitherto, the deposition of the passivation layer has been carried out only for those semiconductor laser diodes which have already been provided with contact metal prior to the passivation. Therefore, the previous methods have been subject to considerable limitations with regard to the choice of materials and parameters. This is essentially attributable to two reasons. Firstly, the high substrate temperature required for optimum deposition (e.g. 500–600° C. for InGaAsP by means of molecular beam epitaxy) leads to irreparable destruction of the contact resistance as a result of diffusion of the contact metal. Secondly, the contact metal, by outgasing contaminates the reactor in which the epitaxy is performed. These contaminants then reach the cleaved edge.

Consequently, the choice of methods and materials for the passivation was hitherto limited to those for which the temperature of the substrate during the deposition is significantly lower than the temperature for the diffusion of the contact metal (350–400° C.) (U.S. Pat. No. 5,933,705). By way of example, the elements Si, Ge, Sb and other materials which are suitable for the passivation are deposited at room temperature. The optimum substrate temperature for the epitaxial growth of ZnSe on GaAs-based semiconductor substrates is 250° C. journal "APPLIED PHYSICS A", 1999, volume 68, pages 627–629). Therefore, ZnSE layers which have been deposited at a low temperature are used for the passivation.

The methods for passivating cleaved edges which have been employed in accordance with the prior art do not offer complete protection against catastrophic optical mirror damage (journal "ELECTRONICS LETTERS", 1999, volume 35 (6), pages 506–508). The passivated high-power laser diodes which are used as pump lasers for optical fibre amplifiers suffer catastrophic optical mirror damage at a very high optical power density (e.g. a few $10^8 W/cm^2$). This is attributed to two main drawbacks of the known methods. Firstly, the passivated cleaved edges still have a high density of absorption centres. The absorption centres are attributable to defects which are able to absorb the light emitted by the laser and are formed, for example, by unsaturated surface bonds, punctiform defects, dislocations, oxides and impurities. Secondly, the materials are structurally unstable over prolonged periods.

The drawback of a cleaved edge of a GaAs substrate which has been passivated with Si resides in the fact that the density of the absorption centres is high (approximately $10^{10}$ $cm^{-2} eV^{-1}$) (journal "VACUUM", 2000, volume 57, pages 111–120). A further drawback results from the fact that layers which consist of the elements Si, Ge or Sb on III–V semiconductor substrates (e.g. GaAs) are polycrystalline or amorphous and can therefore recrystallize. This structural instability can lead to the formation of surface defects, which in turn contribute to catastrophic optical damage.

The drawback of passivation of the cleaved edge with ZnSe is attributable to a reduced crystal quality (journal "APPLIED PHYSICS A", 1999, volume 68, pages 627–629). The ZnSe layers which have been deposited on (011)-GaAs by means of epitaxy have crystal defects with a high density and surface roughness. The laser diodes which are based on the crystal growth of ZnSe on (011)-GaAs are known to degrade rapidly, demonstrating the poor crystal quality of ZnSe on (011)-GaAs. Other materials and methods which are used for passivation in the prior art also have drawbacks. Laser diodes which have been passivated in this way suffer catastrophic optical mirror damage even at lower loads than the laser diodes which are passivated with Si or ZnSe (e.g. journal "ELECTRONICS LETTERS", 1999, volume 35 (6), pages 506–508).

SUMMARY OF THE INVENTION

In accordance with one aspect of the invention, a method for passivating the resonator end face of a semiconductor laser based on III–V semiconductor material comprises: growing a first passivation layer of compound semiconductor $In_xGa_{1-x}As_yP_{1-y}$ ($0 \leq x \leq 1$ and $0 < y \leq 1$) onto the resonator end face by means of epitaxy, wherein the semiconductor laser has not yet been provided with contact metal before the first passivation layer is grown on, the expitaxial growth of the first passivation layer takes place at a temperature which is higher than the diffusion temperature of the contact metal which is to be used, and the contact metal is deposited after the first passivation layer has been grown on.

In accordance with another aspect of the invention, a method for passivating the resonator end face of a semiconductor laser based on III–V semiconductor material comprises: growing a first passivation layer of compound semiconductor $In_xGa_{1-x}As_yP_{1-y}$ ($0 \leq x \leq 1$ and $0 < y \leq 1$) onto the resonator end face by means of epitaxy, wherein the semiconductor laser or an intermediate product which is to be processed to form the semiconductor laser is cleaved from a larger semiconductor crystal prior to the growth of the first passivation layer, so that resonator end faces are formed by the cleaved edges and wherein the semiconductor crystal is clamped into a device, the crystal is brought to the required substrate temperature by means of heater rods fitted in the device or by means of heating radiation, the atmosphere required for the epitaxial growth of the first passivation layer is supplied, the crystal is cleaved by rotation about the cleaved edge, and the first passivation layer is deposited on one cleaved edge or on both cleaved edges simultaneously.

In accordance with another aspect of the invention, a device carries out a method for passivating a resonator end face of a semiconductor laser based on III–V semiconductor material, the method including growing a first passivation layer of compound semiconductor InXGa1-X AsyP1-y ($0 \leq x \leq 1$ and $0 \leq y \leq 1$) onto the resonator end face by means of epitaxy, wherein the semiconductor laser or an intermediate product which is to be processed to form the semiconductor laser is cleaved from a larger semiconductor crystal prior to the growth of the first passivation layer, so that resonator end faces are formed by the cleaved edges, wherein a semiconductor crystal is clamped into a device, the crystal is brought to the required substrate temperature by means of heater rods fitted in the device or by means of heating radiation, the atmosphere required for the epitaxial growth of the first passivation layer is supplied, the crystal is cleaved by rotation about the cleaved edge, and the first passivation layer is deposited on one cleaved edge or on both cleaved edges simultaneously, the device comprising: a reactor chamber for epitaxial growth, two heatable clamping devices which are arranged in the reactor chamber and have clamping regions, into which semiconductor crystals and semiconductor lasers can be securely clamped, the clamping regions of the clamping devices are positioned opposite one another, in such a manner that a semiconductor crystal can be transferred from the clamping region of one clamping device into the clamping region of the other clamping device, and the heatable clamping devices, in the region of the transition between the clamping regions, can be rotated with respect to one another about an axis which runs through the transition region.

BRIEF DESCRIPTION OF THE DRAWINGS

These and other aspects and advantages of the invention will become apparent and more readily appreciated from the following description of the embodiments, taken in conjunction with the accompanying drawings of which:

FIG. 1a shows the semiconductor crystal 3 on which a laser strip 4 has been produced by lithography. The laser facets 5 are provided with two passivation layers 1, 2. The first layer 1 consists of $In_xGa_{1-x}As_yP_{1-y}$, which has been applied by epitaxy. The second layer 2 is a passivation layer for $In_xGa_{1-x}As_yP_{1-y}$, which is selected, for example according to the features of Patent claim 5, from the group of materials consisting of Si, Ge, Sb, $SiN_x$, $GaN_x$, $GaO_2$, SiOx, $Al_2O_3$, ZnSe, ZnS.

FIG. 2a shows two heatable clamping devices 1 which hold the semiconductor crystal 4 and its laser bar 3 which has been cleaved off in place. The clamping device consists of metal or ceramic and is, for example, provided with ceramically insulated heater rods, which are able to heat the semiconductor crystal to the substrate temperature required for the epitaxy. Alternatively, heating radiation can also be used for this purpose. FIG. 2b shows the epitaxial deposition of the material 7, e.g. $In_xGa_{1-x}As_yP_{1-y}$, which follows the cleaving operation. The material is deposited on the cleaved surfaces 5, 6 of the semiconductor crystal either immediately after the cleaving operation or even during the cleaving.

DETAILED DESCRIPTION OF THE PREFERRED EMBODIMENT

The present invention is based on the object of providing a semiconductor laser based on III–V semiconductor material with an increased service life, and a method for producing it. In particular, the object consists in reducing or completely avoiding the risk of catastrophic optical mirror damage at an extremely high density of the optical power. This object is achieved by means of the features of the independent patent claims. Advantageous refinements are given in the subclaims.

The invention relates to a semiconductor laser with resonator end faces which have been passivated in accordance with the invention, a method for producing the passivation layers, in further method steps defined in subclaims, which take place either before or after the application of the passivation layers and advantageously interact with the passivation method, a device for cleaving the semiconductor lasers and for epitaxial growth of the passivation layers, and a device for the simultaneous application of metallic contact-making layers to a plurality of semiconductor lasers.

A main aspect of the present invention consists in improving the passivation of the resonator end faces by almost completely passivating the defects at the resonator end face. This is achieved by deposition of an epitaxial III–V semiconductor layer, in particular an epitaxial $In_xGa_{1-x}As_yP_{1-y}$ layer ($0 \leq x \leq 1$ and $0 \leq y \leq 1$), on the resonator end face. The choice of this material makes it possible to reduce the density of absorption centres at the resonator end face compared to the prior art and, at the same time, to produce a protective layer which is stable with respect to corrosion of the semiconductor laser. This material and its epitaxial growth ideally saturate all the surface bonds on the resonator end face, since the semiconductor structure based on III–V semiconductor material is continued by the $In_xGa_{1-x}As_yP_{1-y}$ layer. The semiconductor laser itself can in principle consist of any desired binary, ternary or quaternary III–V semiconductor material.

The invention can be applied particularly advantageously to semiconductor lasers which are obtained by cleaving from a larger, epitaxially grown semiconductor crystal (bar), i.e. in which the resonator end faces are formed by cleaved edges. In this case, the invention can advantageously be developed in such a way that the cleaving of the semiconductor crystal is performed in the same device in which the epitaxial growth of the passivation layer is also performed, as explained in more detail below. The invention is based on the idea, inter alia, that the electrical contact-making, i.e. the application of metallic coatings for making electrical contact with the laser diode, is only carried out after the passivation layer has been applied. Only this measure makes it possible to use a relatively high substrate temperature (e.g. 500° C.–600° C.) for the epitaxy.

Figure 1A:
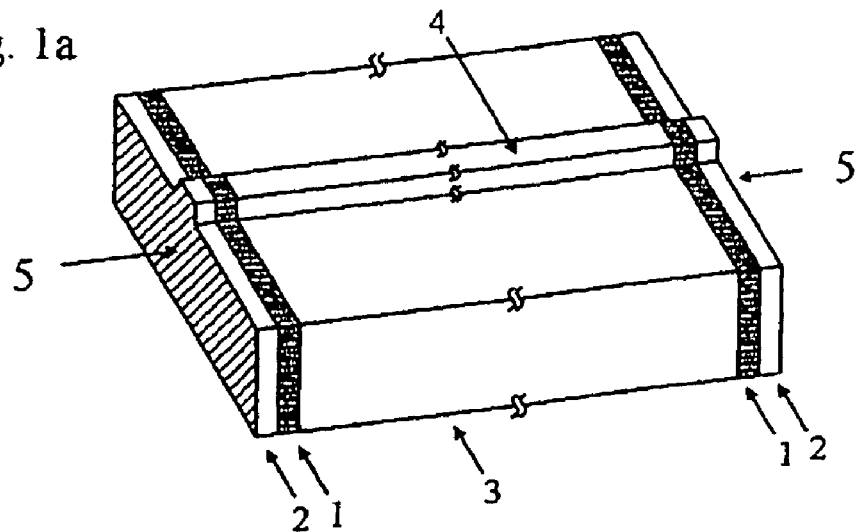
FIGS. 1a and 1b are perspective views of structured lasers in the form of a chip, FIG. 1a, and in the form of a laser bar, FIG. 1b.
Figure 1B:
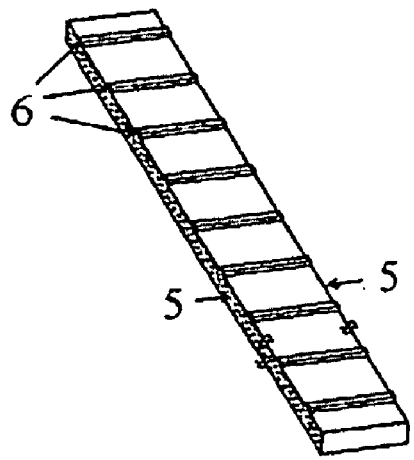
Figure 2A:
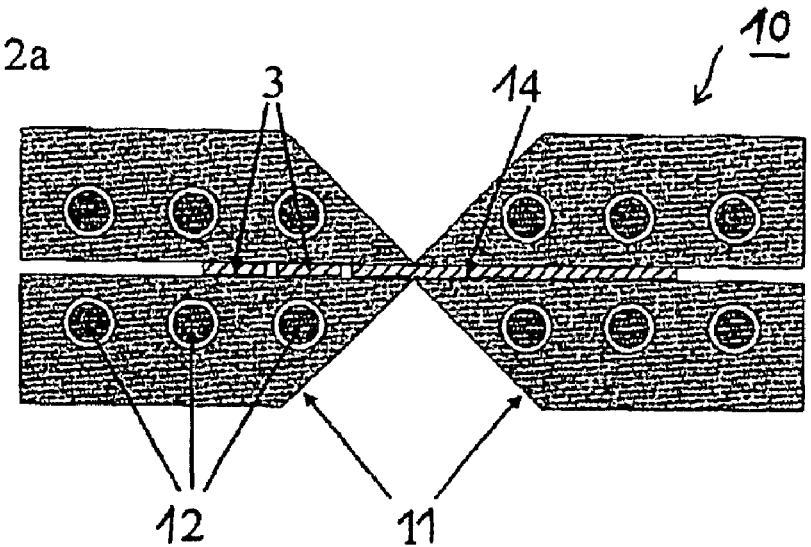
FIGS. 2a and 2b are sectional views of the device and method for the in-situ cleavage with subsequent epitaxy at high temperature.
Figure 2B:
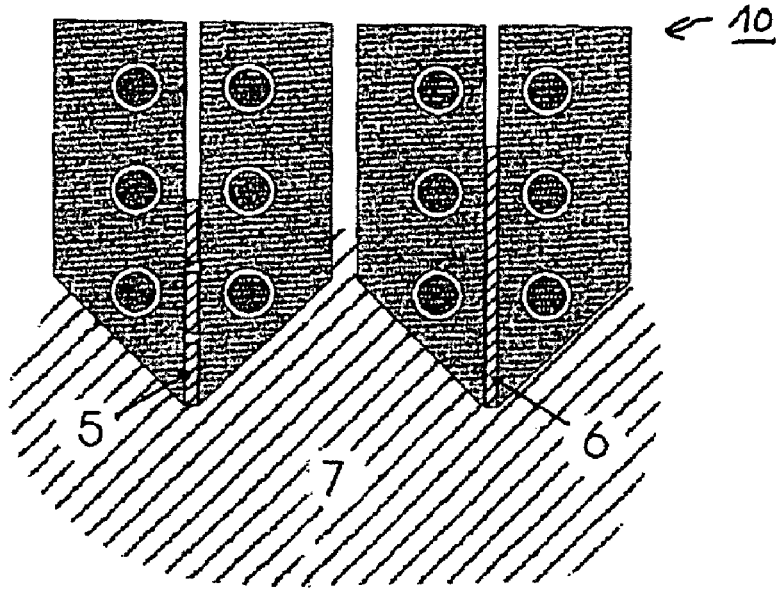

A further aspect of the present invention, that of substantially avoiding contamination to the cleaved surface, is achieved through the fact that the crystal cleavage required to produce the cleaved edge is carried out in situ, i.e. the crystal is cleaved inside the reactor in which the epitaxy is carried out, since epitaxy reactors always have minimal concentrations of oxygen and impurities. As a result, oxidation of the cleaved edge prior to the application of the epitaxy layer is avoided. Although in-situ cleavage operations of this type with subsequent crystal growth on the cleaved edge have already been described in the literature and are known as cleaved edge overgrowth (CEO), hitherto only epitaxial deposition of arsenides, such as GaAs and AlGaAs, on the cleaved edge of a coated GaAs substrate by means of CEO has been described, but not in connection with passivation of laser facets. The heteroepitaxial deposition of $In_xGa_{1-x}As_yP_{1-y}$ on the cleaved edge by means of CEO is presented for the first time in the present invention. In one embodiment, a semiconductor crystal is cleaved into individual semiconductor lasers, heated to a defined temperature and epitaxially coated with the passivation layer in a single device. This can be achieved by using a special device as illustrated in FIG. 2. In this device, the semiconductor crystal 4 is clamped into the device 10. Then, the crystal is brought to the required substrate temperature by means of heater rods 12 which are incorporated in the device. The heating prior to the crystal cleavage is used to outgas the device. After the required substrate temperature has been established, the atmosphere required for epitaxy (FIG. 2b, 7) is supplied. This atmosphere consists of molecular beam, gas or liquid, depending on the epitaxy method used (e.g. molecular beam epitaxy, vapour phase epitaxy, liquid phase epitaxy). Then, the crystal is cleaved by rotation about the cleaved edge (axis of rotation). By way of example, in the case of a III–V semiconductor substrate, the rotation takes place about the [110] crystal axis, the direction of which predetermines the natural cleaved edge. The epitaxial layer is then deposited on both cleaved edges 5, 6 simultaneously. As soon as the required layer thickness has been reached, the supply of the epitaxial atmosphere is interrupted. The result of this process is laser bars which have been passivated on both sides and are produced by repeating the process.

The density of the absorption centres on the $In_xGa_{1-x}As_yP_{1-y}$ passivation layer can be reduced by depositing a second passivation layer, preferably likewise in situ, i.e. in the same reactor, on the $In_xGa_{1-x}As_yP_{1-y}$, i.e. the deposition of the second layer takes place in the epitaxy installation or in a chamber which is directly connected to it. This layer can be selected from the group of materials consisting of Si, Ge, Sb, $SiN_x$, $GaN_x$, ZnSe, ZnS, $GaO_2$, $SiO_x$, $Al_2O_3$. An alternative method for the deposition of a phosphide layer on GaAs-based semiconductors is the exchange reaction of arsenic and phosphorus by means of a carrier gas, such as tert-butylphosphine (TBP), in a vapour phase epitaxy reactor. The object of producing epitaxial $In_xGa_{1-x}P$ ($0 \leq x \leq 1$) by exchange reaction in order to passivate the cleaved edge is achieved in accordance with the features of Patent claim 6.

Figure 3:
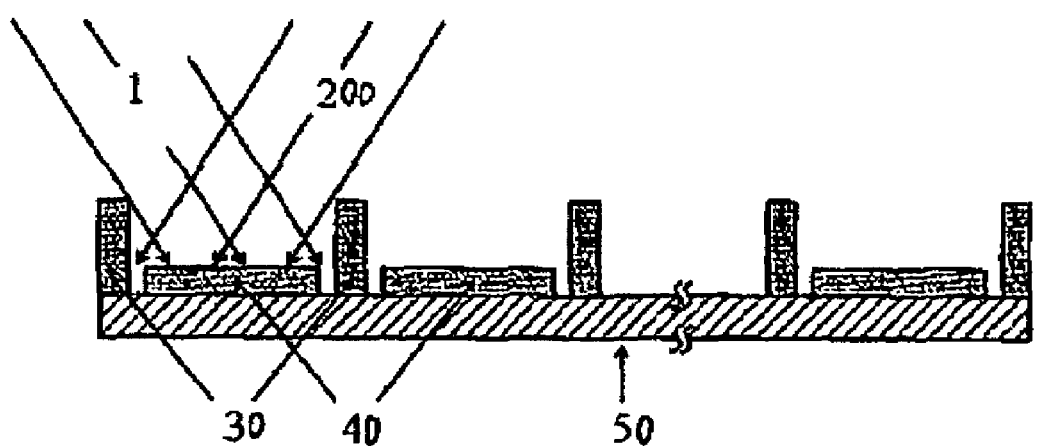
FIG. 3 is a sectional view of the device and method used for deposition of the contact metal on the passivated laser bars. The laser bars 40 have been clamped securely on a disc 50, for example by springs. The laser bars 40 are protected by shadow masks 30 in such a way that the metal beams 100, 200 do not impinge on the cleaved edges during the deposition of the contact metal.

The object of applying the contact metal to the cleaved laser bars after the passivation is achieved by a special device (FIG. 3). This device enables the laser bars 4 to be coated with the metal in such a way that the mirror surfaces are not contaminated. The device comprises a planar disc 5, on which the laser bars are clamped securely, for example by springs. Strip-like elevations 3 which serve as shadow masks, directly adjoin the mirror facets of the laser bars. The metal deposition is carried out in a metal-coating installation in which a targeted metal beam originates from a localized source. Installations of this type are known as electron beam vaporizers or sputtering installations. The coating is carried out in such a way that the first metal beam 1 impinges on the laser bars at a small angle with respect to the vertical. The angle is selected in such a way that both mirror facets lie in the shadow of the beam and at the same time vapour deposition is carried out on the largest possible area of the laser bar. The region on the surface of the laser bar which lies in the shadow of the first beam is coated by a second beam 2. Alternatively, the second beam may also originate from the same source and be used to metallize the laser bar after the first coating operation as a result of the device being rotated through the corresponding angle.

The invention claimed is:

1. A method for passivating the resonator end face of a semiconductor laser based on III–V semiconductor material, the method comprising:
    growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein the semiconductor laser has not yet been provided with contact metal before the first passivation layer is grown on, the expitaxial growth of the first passivation layer takes place at a temperature which is higher than the diffusion temperature of the contact metal which is to be used, and the contact metal is deposited after the first passivation layer has been grown on.

2. A method for passivating the resonator end face of a semiconductor laser based on III–V semiconductor material, the method comprising:
    growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein the semiconductor laser or an intermediate product which is to be processed to form the semiconductor laser is cleaved from a larger semiconductor crystal prior to the growth of the first passivation layer, so that resonator end faces are formed by the cleaved edges and wherein the semiconductor crystal is clamped into a device, the crystal is brought to the required substrate temperature by means of heater rods fitted in the device or by means of heating radiation, the atmosphere required for the epitaxial growth of the first passivation layer is supplied, the crystal is cleaved by rotation about the cleaved edge, and the first passivation layer is deposited on one cleaved edge or on both cleaved edges simultaneously.

3. A method for passivating the resonator end face of a semiconductor laser based on III–V semiconductor material, the method comprising:
growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein a number of semiconductor lasers, which are provided with first and if appropriate second passivation layers, are fixed in a device with shadow masks, the contact metal is deposited by two targeted beams, which impinge on a laser bar at an angle such that the entire surface of the laser is coated, but laser mirrors are not contaminated with metal on account of the shadow masks.

4. A device for carrying out a method for passivating a resonator end face of a semiconductor laser based on III–V semiconductor material, the method including growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein the semiconductor laser or an intermediate product which is to be processed to form the semiconductor laser is cleaved from a larger semiconductor crystal prior to the growth of the first passivation layer, so that resonator end faces are formed by the cleaved edges, wherein a semiconductor crystal is clamped into a device, the crystal is brought to the required substrate temperature by means of heater rods fitted in the device or by means of heating radiation, the atmosphere required for the epitaxial growth of the first passivation layer is supplied, the crystal is cleaved by rotation about the cleaved edge, and the first passivation layer is deposited on one cleaved edge or on both cleaved edges simultaneously, the device comprising: a reactor chamber for epitaxial growth, two heatable clamping devices which are arranged in the reactor chamber and have clamping regions; into which semiconductor crystals and semiconductor lasers can be securely clamped, the clamping regions of the clamping devices are positioned opposite one another, in such a manner that a semiconductor crystal can be transferred from the clamping region of one clamping device into the clamping region of the other clamping device, and the heatable clamping devices, in the region of the transition between the clamping regions, can be rotated with respect to one another about an axis which runs through the transition region.

5. A device for carrying out a method for passivating a resonator end face of a semiconductor laser based on III–V semiconductor material, the method including: growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein a number of semiconductor lasers, which are provided with first and if appropriate second passivation layers, are fixed in a device with shadow masks, the contact metal is deposited by two targeted beams, which impinge on a laser bar at an angle such that the entire surface of the laser is coated, but laser mirrors are not contaminated with metal on account of the shadow masks, the device comprising: a reactor chamber for the deposition of metal contacts, a substrate disc for holding a plurality of laser bars, a plurality of shadow masks, which are arranged in an alternating sequence with the laser bars on the substrate disc, and means for enabling the laser bars to be acted on by metallic material in beam form from two sides, in each case at an oblique angle.

6. A method for passivating a resonator end face of a semiconductor laser based on III–V semiconductor material, the method comprising: growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein the semiconductor laser has not yet been provided with contact metal before the first passivation layer is grown on, the expitaxial growth of the first passivation layer takes place at a temperature which is higher than the diffusion temperature of the contact metal which is to be used, and the contact metal is deposited after the first passivation layer has been grown on.

7. A method for passivating a resonator end face of a semiconductor laser based on III–V semiconductor material, the method comprising: growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein the semiconductor laser or an intermediate product which is to be processed to form the semiconductor laser is cleaved from a larger semiconductor crystal prior to the growth of the first passivation layer, so that resonator end faces are formed by the cleaved edges, and wherein a semiconductor crystal is clamped into a device, the crystal is brought to the required substrate temperature by means of heater rods fitted in the device or by means of heating radiation, the atmosphere required for the epitaxial growth of the first passivation layer is supplied, the crystal is cleaved by rotation about the cleaved edge (axis of rotation), and the first passivation layer is deposited on one cleaved edge or on both cleaved edges simultaneously.

8. A method for passivating a resonator end face of a semiconductor laser based on III–V semiconductor material, the method comprising: growing a first passivation layer of compound semiconductor $In_xGa_{1-x}As_yP_{1-y}$ ($0 \leq x \leq 1$ and $0 \leq y \leq 1$) onto the resonator end face by means of epitaxy, wherein a number of semiconductor lasers, which are provided with first and if appropriate second passivation layers, are fixed in a device with shadow masks, the contact metal is deposited by two targeted beams, which impinge on a laser bar at an angle such that the entire surface of the laser is coated, but laser mirrors are not contaminated with metal on account of the shadow masks.

* * * * *

UNITED STATES PATENT AND TRADEMARK OFFICE
CERTIFICATE OF CORRECTION

| | | |
|---|---|---|
| PATENT NO. | : 7,033,852 B2 | Page 1 of 1 |
| APPLICATION NO. | : 10/381810 | |
| DATED | : April 25, 2006 | |
| INVENTOR(S) | : Karl Häusler et al. | |

It is certified that error appears in the above-identified patent and that said Letters Patent is hereby corrected as shown below:

On The Title Page:
    Item [75] Inventors: Please ADD
    --Karl Eberl, Berlin (DE)--.

Signed and Sealed this

Thirty-first Day of October, 2006

JON W. DUDAS
*Director of the United States Patent and Trademark Office*